United States Patent
Frans et al.

(10) Patent No.: US 7,248,086 B2
(45) Date of Patent: Jul. 24, 2007

(54) LEAKAGE COMPENSATION FOR CAPACITORS IN LOOP FILTERS

(75) Inventors: Yohan Frans, Palo Alto, CA (US); Nhat M. Nguyen, San Jose, CA (US)

(73) Assignee: Rambus, Inc., Los Altos, CA (US)

( * ) Notice: Subject to any disclaimer, the term of this patent is extended or adjusted under 35 U.S.C. 154(b) by 0 days.

(21) Appl. No.: 11/084,438

(22) Filed: Mar. 17, 2005

(65) Prior Publication Data

US 2005/0168292 A1    Aug. 4, 2005

Related U.S. Application Data

(63) Continuation of application No. 10/638,717, filed on Aug. 11, 2003, now Pat. No. 6,963,232.

(51) Int. Cl.
*H03L 7/06* (2006.01)

(52) U.S. Cl. ........................ 327/147; 327/156

(58) Field of Classification Search ............... 347/147, 347/148, 156, 157, 162, 362, 163; 331/17, 331/25, DIG. 2; 375/373–376
See application file for complete search history.

(56) References Cited

U.S. PATENT DOCUMENTS

| | | | |
|---|---|---|---|
| 4,987,387 A | 1/1991 | Kennedy et al. ............... 331/1 |
| 5,315,623 A | 5/1994 | Kuo ............................. 375/120 |
| 5,659,588 A | 8/1997 | Fiedler ......................... 375/376 |
| 5,691,657 A * | 11/1997 | Hirano et al. ................. 327/94 |
| 6,014,042 A | 1/2000 | Nguyen ........................ 327/3 |
| 6,054,903 A | 4/2000 | Fiedler ......................... 331/17 |
| 6,111,469 A | 8/2000 | Adachi ........................ 331/17 |
| 6,366,144 B2 | 4/2002 | Han ............................. 327/156 |
| 6,373,293 B1 | 4/2002 | Best ............................. 327/2 |
| 6,420,914 B1 | 7/2002 | Hasegawa .................... 327/112 |
| 6,480,035 B1 | 11/2002 | Donnelly et al. .............. 327/3 |

(Continued)

FOREIGN PATENT DOCUMENTS

EP    1 237 283 A2    4/2002

OTHER PUBLICATIONS

Reuven Holzer, "A 1V CMOS PLL Designed in High-Leakage CMOS Process Operating at 10-700MHz" Feb. 5, 2002, 10 pages, presented at 2002 IEEE International Solid-State Circuits Conference.

*Primary Examiner*—Linh My Nguyen
(74) *Attorney, Agent, or Firm*—Silicon Edge Law Group LLP.; Arthur J. Behiel

(57) ABSTRACT

A loop filter of a compensating phase-locked loop contains capacitors formed from transistors with thin gate oxide dielectric layers. Leakage current leaks through the capacitors. To avoid jitter in the output signal of the phase-locked loop that would otherwise be caused by the leakage current, a leakage compensation circuit is provided. The leakage compensation circuit of a first embodiment replicates the leakage current using a replication capacitor and a current mirror. The voltage across the replication capacitor is proportional to the control voltage of a voltage-controlled oscillator of the compensating phase-locked loop. A second embodiment generates the compensation current by controlling the voltage on the gate of a transistor. The gate voltage depends on charge added and subtracted by a charge pump in addition to the charge pumps in the loop filter. A third embodiment applies a leakage compensation circuit to a delay locked loop.

26 Claims, 6 Drawing Sheets

U.S. PATENT DOCUMENTS

| | | |
|---|---|---|
| 6,504,438 B1 | 1/2003 | Chang et al. .................. 331/17 |
| 6,539,072 B1 | 3/2003 | Donnelly et al. ............ 375/371 |
| 6,570,422 B1 | 5/2003 | Trivedi et al. ............... 327/157 |
| 6,570,423 B1 | 5/2003 | Trivedi et al. ............... 327/157 |
| 6,573,770 B1 * | 6/2003 | Gauthier et al. ............. 327/156 |
| 6,597,219 B1 | 7/2003 | Trivedi et al. ............... 327/158 |
| 6,614,287 B1 | 9/2003 | Gauthier et al. ............. 327/362 |
| 2003/0038661 A1 | 2/2003 | Chokkalingam et al. ..... 327/157 |

* cited by examiner

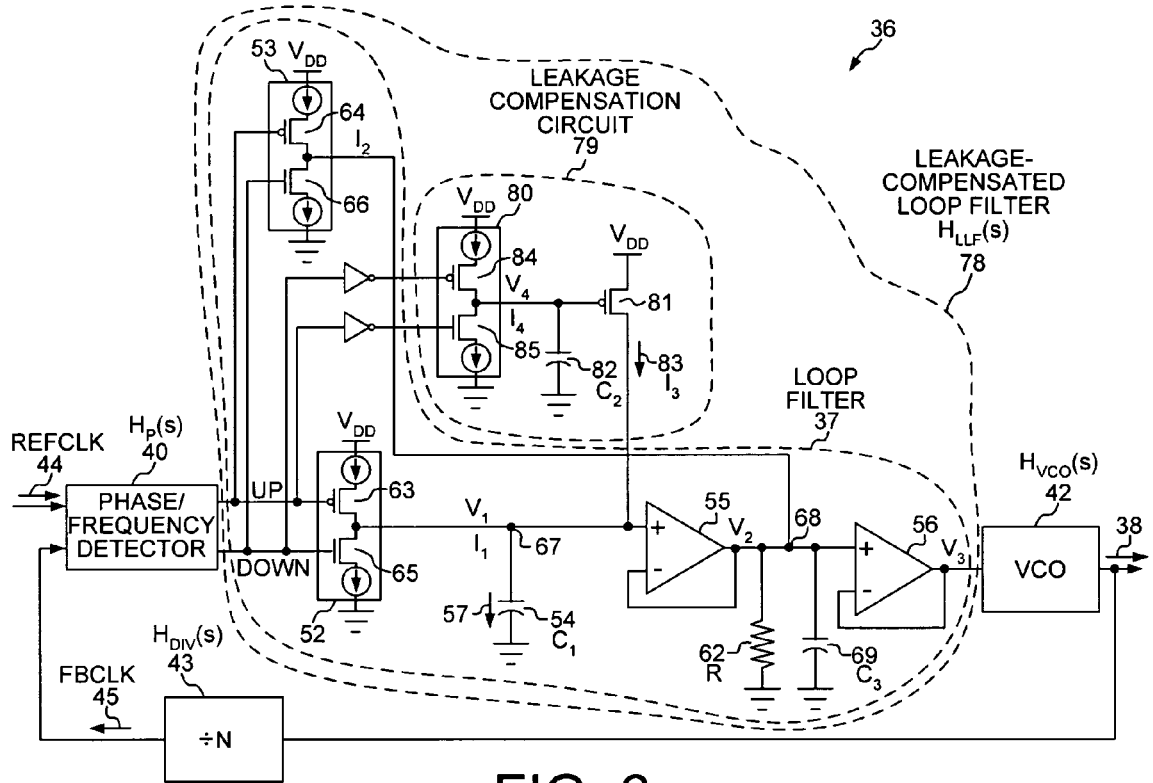

FIG. 6

$$H(s) = H_P(s) \cdot H_{LLF}(s) \cdot H_{VCO}(s) \cdot H_{DIV}(s)$$

$$H_P(s) = K_P \qquad H_{VCO}(s) = \frac{K_{VCO}}{s} \qquad H_{DIV}(s) = K_{DIV}$$

$$H_{LLF}(s) = \frac{\left(\frac{I_1}{2\pi C_1}\right)\left(s^2\left(\frac{I_2}{I_1}\cdot RC_1 + RC_3\right) + s\left(1 + \frac{I_3 G_M RC_3}{I_1 C_2}\right) + \frac{I_3 G_M}{I_1 C_2}\right)}{s^2(1+sRC_3)}$$

$$H(s) = K_P \cdot \frac{\left(\frac{I_1}{2\pi C_1}\right)\left(s^2\left(\frac{I_2}{I_1}\cdot RC_1 + RC_3\right) + s\left(1 + \frac{I_3 G_M RC_3}{I_1 C_2}\right) + \frac{I_3 G_M}{I_1 C_2}\right)}{s^2(1+sRC_3)} \cdot \frac{K_{VCO}}{s} \cdot K_{DIV}$$

(86) $\quad \omega_z = \dfrac{-\left(1 + \frac{I_3 G_M RC_3}{I_1 C_2}\right) \pm \sqrt{\left(1 + \frac{I_3 G_M RC_3}{I_1 C_2}\right)^2 - 4\left(\frac{I_2}{I_1}\cdot RC_1 + RC_3\right)\left(\frac{I_3 G_M}{I_1 C_2}\right)}}{2\left(\frac{I_2}{I_1}\cdot RC_1 + RC_3\right)}$

FIG. 7

LEAKAGE COMPENSATION FOR CAPACITORS IN LOOP FILTERS

CROSS REFERENCE TO RELATED APPLICATION

This application is a continuation of, and claims priority under 35 U.S.C. §120 from, nonprovisional U.S. patent application Ser. No. 10/638,717 entitled "Compensator for Leakage through Loop Filter Capacitors in Phase-Locked Loops," filed on Aug. 11, 2003, now U.S. Pat. No. 6,963,232, the subject matter of which is incorporated herein by reference.

TECHNICAL FIELD

This patent document relates to phase-locked loops, and more particularly, to methods and circuits that compensate for leakage currents through loop filter capacitors.

BACKGROUND INFORMATION

A phase-locked loop (PLL) typically includes a loop filter, and the loop filter typically includes an integration capacitor. Where the PLL is manufactured using complementary metal-oxide semiconductor (CMOS) processes, the gate capacitance of an n-channel field-effect transistor (FET) can be used as the integration capacitor. As advances are made in CMOS processing technology, however, gate oxide dielectric thickness is becoming thinner. Significant current leakage can occur from the gate electrode, through the thin gate oxide, and to the inversion channel of the transistor.

FIG. 1 (prior art) illustrates an example of a PLL 10 of the prior art that includes a phase detector 11, a charge pump 12, a loop filter 13, a voltage-controlled oscillator (VCO) 14 and a frequency divider 15. Phase detector 11 compares the phase of a reference signal REFCLK 16 to the phase of a feedback signal FBCLK 17 and generates phase-error signals. Feedback signal 17 is a "divide-by-n" signal output by frequency divider 15. Frequency divider 15 divides the frequency of a clock signal 18 output by VCO 14. When the phase of feedback signal 17 lags behind that of reference signal 16, phase detector 11 generates an up control signal 19. When the phase of feedback signal 17 leads that of reference signal 16, phase detector 11 generates a down control signal 20. Charge pump 12 adds charge to its output lead 21 upon receiving up control signal 19 and drains charge from its output lead 21 upon receiving down control signal 20.

Loop filter 13 is typically a low-pass filter. Loop filter 13 filters out reference frequency sidebands introduced by phase detector 11 from the output of charge pump 12. Loop filter 13 has an integration capacitor 22 and a much smaller integration capacitor 23 that integrate the charge that is output by charge pump 12. VCO 14 receives the filtered output of charge pump 12. Upon receiving a higher input voltage, VCO 14 outputs clock signal 18 with a higher frequency. Clock signal 18 has a lower frequency when VCO 14 receives a lower input voltage. Thus, the frequency of clock signal 18 is proportional to the charge that accumulates on output lead 21 of charge pump 12. PLL 10 adjusts the frequency of clock signal 18 in response to measuring the phase difference between reference signal 16 and feedback signal 17 and thereby brings feedback signal 17 into phase lock with reference signal 16.

Current leakage across integration capacitors 22 and 23 introduces noise into the voltage signal supplied to VCO 14. Current leakage across integration capacitors can be reduced by using capacitors with metal plates. Realizing a capacitor of a given capacitance using a metal plate structure can require many times more semiconductor die area than realizing the capacitor using the gate capacitance of a FET. Moreover, the capacitance of metal plate capacitor structures can vary considerably from die to die and can be difficult to control.

Current leakage across integration capacitors can also be reduced by using transistors with thick gate oxides. A transistor with a thick gate oxide, however, provides less capacitance per unit of semiconductor die area as compared to a transistor with a thin gate oxide. Moreover, a thick gate oxide transistor typically has a higher threshold ("turn-on") voltage, which limits the voltage range on the node of output lead 21. The limited voltage range on node 21 limits the range of frequencies over which the PLL can be locked.

FIG. 2A (prior art) shows a prior art PLL 25 that has been adapted to be stable over a wide frequency range. Like reference numerals in FIGS. 2A and 1 designate like or similar parts. Integration capacitors 26 and 27 of loop filter 13 are both realized using n-channel transistors. Capacitor 26 is coupled between a first node 31 and ground. First node 31 is the non-inverting input lead of a first voltage follower 28. Capacitor 27 is coupled between a second node 32 and ground. Second node 32 is the output lead of first voltage follower 28 and the non-inverting input lead of a second voltage follower 29. PLL 25 includes a second charge pump 30 that outputs a larger amount of charge onto second node 32 than charge pump 12 outputs onto first node 31. Charge that coarsely adjusts frequency thereby reaches VCO 14 faster than charge for fine adjustment of frequency. This reduces the tendency of clock signal 18 to overshoot the desired phase correction and makes the loop more stable. PLL 25 nevertheless suffers from noise caused by current leakage through integration capacitors 26 and 27.

FIG. 2B (prior art) is a waveform diagram that illustrates noise in the control voltage on a third node 33 of PLL 25 that is coupled to the input of VCO 14. FIG. 2B also illustrates voltage amplitudes for various other signals on PLL 25 when feedback signal 17 lags reference signal 16 by a time period 34. Current leakage through integration capacitors 26 and 27 causes a jitter in the control voltage on third node 33. Without the effects of current leakage, the control voltage on third node 33 would have a relatively stable average amplitude 35.

A method is thus desired that reduces the effects of current leakage through integration capacitors, but that does not negate the advantages of using FET transistors to form those integration capacitors in phase-locked loops.

BRIEF DESCRIPTION OF THE DRAWINGS

The accompanying drawings, where like numerals indicate like components, illustrate embodiments of the invention.

FIG. 6 is a simplified block diagram of a PLL with a leakage compensation circuit in accordance with a second embodiment.

FIG. 7 is an open-loop transfer function of the PLL of FIG. 6.

DETAILED DESCRIPTION OF THE DRAWINGS

Figure 1:
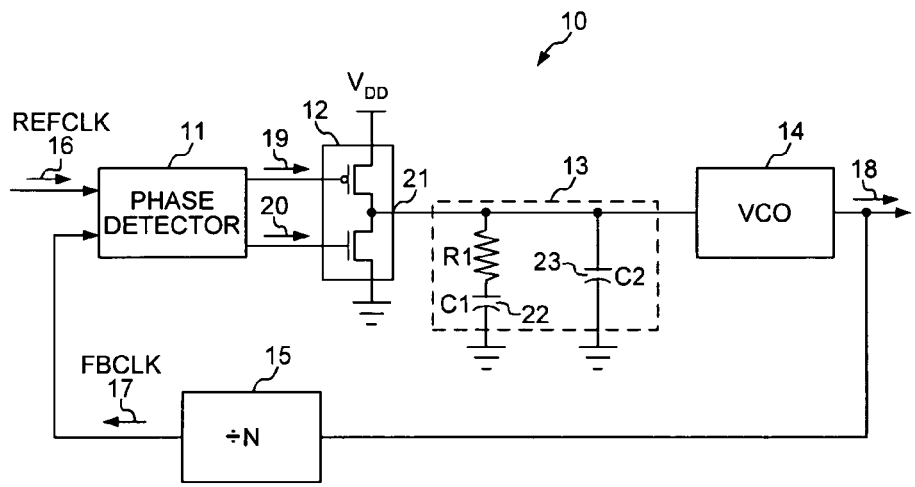
FIG. 1 (prior art) is a simplified block diagram of a PLL of the prior art.
Figure 2A:
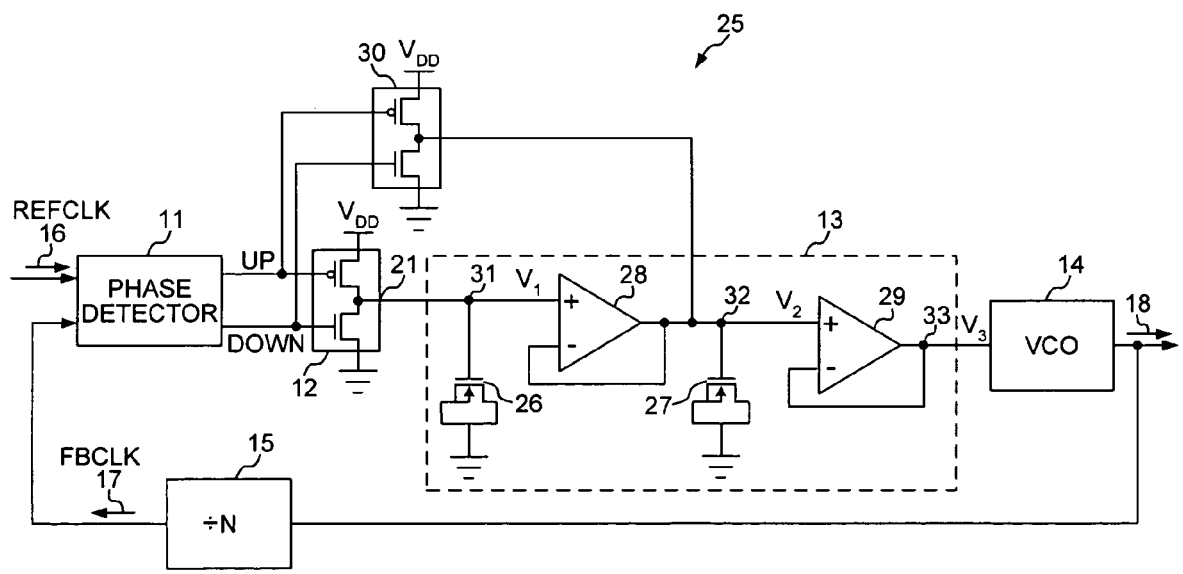
FIG. 2A (prior art) is a simplified block diagram of an adapted PLL of the prior art.
Figure 2B:
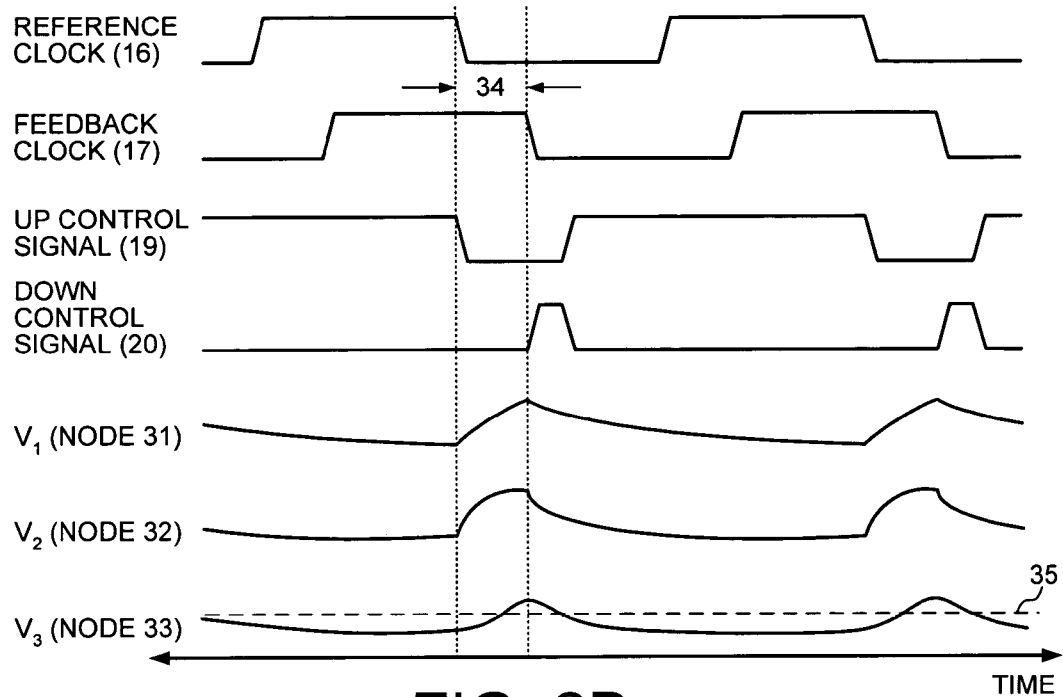
FIG. 2B (prior art) is a waveform diagram illustrating noise in a control voltage where a feedback signal lags a reference signal in the adapted PLL of FIG. 2A.

A compensating phase-locked loop contains a loop filter and outputs a clock signal. The loop filter includes an integration capacitor. In a first embodiment, the integration capacitor is a transistor having a thin gate oxide dielectric layer. To avoid jitter in the output signal that would otherwise be caused by a leakage current that leaks through the integration capacitor, a leakage compensation circuit is provided. The leakage compensation circuit adds a compensation current to the integration capacitor that substantially offsets the leakage current.

In the first embodiment, the leakage compensation circuit replicates the leakage current using a second capacitor and a current mirror. The second capacitor has a similar construction to that of the integration capacitor and therefore leaks in a similar manner. The voltage across the second capacitor is dependent on the control voltage of a voltage-controlled oscillator of the compensating phase-locked loop, which in turn is dependent on the voltage on the integration capacitor. The leakage current is also dependent on the voltage on the integration capacitor. The current mirror thus generates the compensation current with a magnitude proportional to the current that leaks through the second capacitor.

The compensation current is set to be substantially equal to the leakage current. The magnitude of the leakage current depends on the voltage across the integration capacitor. The voltage across the integration capacitor varies with the operating frequency of the compensating phase-locked loop. In steady state at each frequency, the relative durations of the up and down control signals thus depend on the magnitude of the leakage current.

In a second embodiment, a leakage compensation circuit generates a compensation current using the same up and down control signals employed to maintain phase lock. The leakage compensation circuit of the second embodiment includes a compensation charge pump, a second capacitor, and a transistor having a control terminal connected to the second capacitor. The compensation charge pump adds charge to and subtracts charge from the second capacitor based on the relative durations of the up and down control signals employed by the PLL. The charge on the second capacitor effects the control voltage of the transistor, causing the current through the transistor to vary based on the relative durations of the up and down control signals. The resulting compensation current is added to the integration capacitor to offset the leakage current. The compensation current is set to be substantially equal to the leakage current.

In a third embodiment, a compensating delay-locked loop (DLL) includes a leakage compensation circuit that adds a compensation current to an integration capacitor such that a leakage current is substantially offset. The leakage compensation circuit of the third embodiment replicates the leakage current in a manner similar to that of the leakage compensation circuit of the first embodiment.

A method is disclosed for supplying a compensation current to compensate for a leakage current through an integration capacitor.

Figure 3:
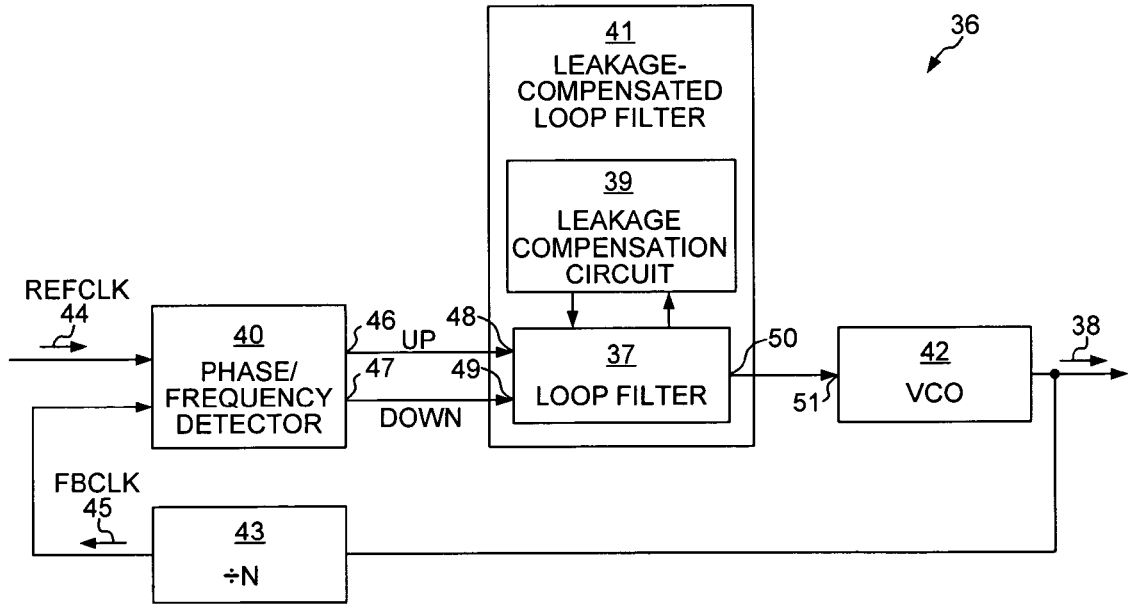
FIG. 3 is a simplified block diagram of a PLL with a leakage compensation circuit in accordance with a first embodiment.

FIG. 3 shows a compensating phase-locked loop (CPLL) 36. A first embodiment of CPLL 36 is manufactured using CMOS processes, and CPLL 36 contains capacitors formed from n-channel FET transistors. CPLL 36 includes a loop filter 37 that employs an integration capacitor with a thin gate dielectric layer. A leakage current leaks between the gate electrode and the inversion channel of the integration capacitor. To avoid jitter in a clock signal 38 output by CPLL 36 that would otherwise be caused by the leakage current, a leakage compensation circuit 39 is provided. Leakage compensation circuit 39 outputs a compensation current that compensates for the leakage current.

In the first embodiment, CPLL 36 includes a phase/frequency detector 40, a leakage-compensated loop filter 41, a voltage-controlled oscillator (VCO) 42, and a divide-by-N frequency divider 43. Leakage-compensated loop filter 41 comprises loop filter 37 and leakage compensation circuit 39. Phase/frequency detector 40 compares the phase of a reference signal REFCLK 44 to the phase of a feedback signal FBCLK 45 and generates phase-error control signals. When the phase of feedback signal 45 lags behind that of reference signal 44, up control signals (lag signals) are output onto an output lead 46 of phase/frequency detector 40. When the phase of feedback signal 45 leads that of reference signal 44, down control signals (lead signals) are output onto an output lead 47 of phase/frequency detector 40. Up control signals are received on input lead 48 of loop filter 37, and down control signals are received on input lead 49 of loop filter 37. A control voltage is output onto an output lead 50 of loop filter 37, which is coupled to an input lead 51 of VCO 42. The control voltage controls the frequency of clock signal 38. Feedback signal 45 is generated when frequency divider 43 divides clock signal 38. Although the first embodiment includes phase/frequency detector 40, other embodiments include only a phase detector.

Figure 4:
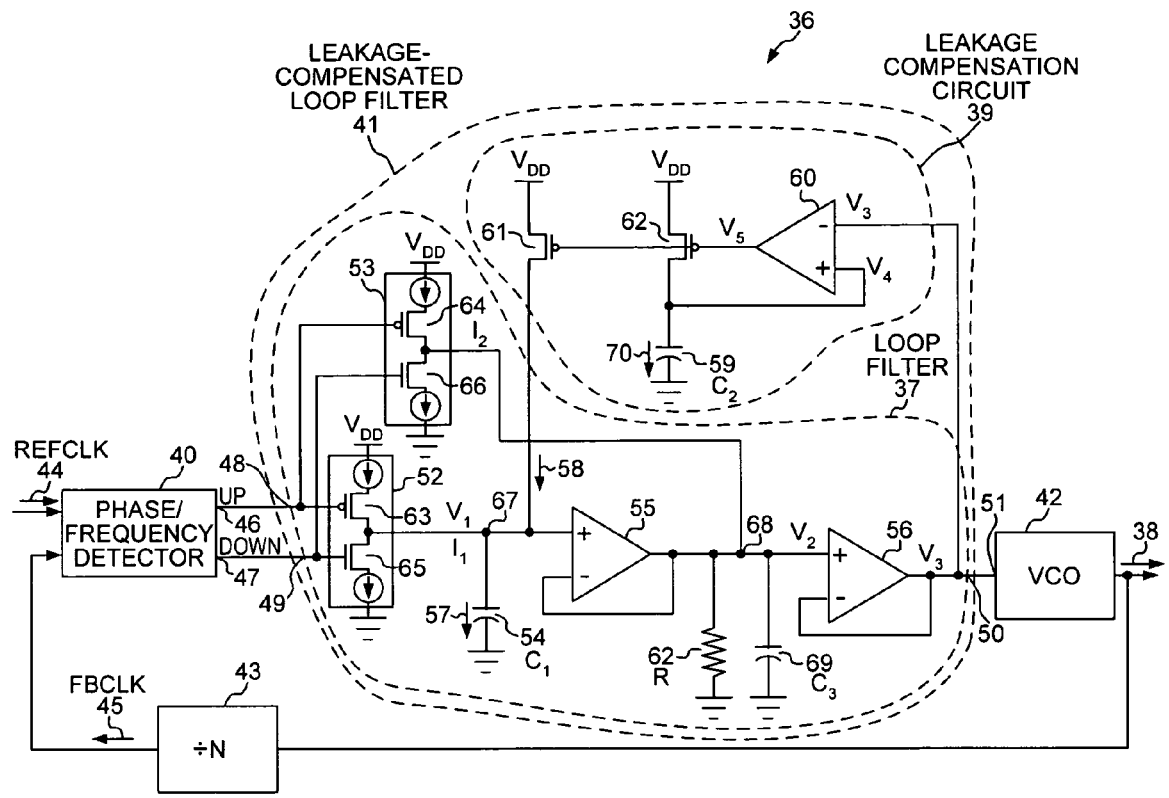
FIG. 4 is a more detailed block diagram of the first embodiment of a PLL with a leakage compensation circuit.

FIG. 4 shows the first embodiment of CPLL 36 in more detail. Loop filter 37 includes a first charge pump 52, a second charge pump 53, a first integration capacitor (C1) 54, a first voltage follower 55 and a second voltage follower 56. First capacitor (C1) 54 has a thin gate dielectric layer. A leakage current 57 leaks between the gate electrode and the inversion channel of first capacitor 54. Leakage compensation circuit 39 outputs a compensation current 58 that compensates for leakage current 57. Leakage compensation circuit 39 includes a second capacitor (C2) 59, an operational amplifier 60, a first p-channel field effect transistor (FET) 61 and a second p-channel FET 62.

Phase/frequency detector 40 compares the phase of reference signal 44 to the phase of feedback signal 45 and generates phase-error signals in the form of rectangular waves. Although phase-error signals are generated at the frequency of reference signal 44, the closed loop bandwidth is at a lower frequency. The phase error signals selectively cause charge pumps 52 and 53 to increase and decrease control voltage provided to VCO 42. Up control signals and down control signals can be simultaneously active. VCO 42 outputs clock signal 38 having a frequency proportional to a control voltage $V_3$. Frequency divider 43 receives clock signal 38, divides the frequency by "N" and outputs feedback signal 45. Although N can be any number, N is typically an integer in the range of two to six. Where N is one, frequency divider 43 can be omitted. Feedback signal 45 is thus brought into phase lock with reference signal 44.

The voltage state of an up control signal UP depends on the time period by which an edge of feedback signal 45 lags behind an edge of reference signal 44. The voltage state of a down control signal DOWN depends on the time period by which an edge of feedback signal 45 leads an edge of reference signal 44. Up control signals are received on the gate of a p-channel transistor 63 of first charge pump 52, as well as on the gate of a p-channel transistor 64 of second charge pump 53. Down control signals are received on the gate of an n-channel transistor 65 of first charge pump 52, as well as on the gate of an n-channel transistor 66 of second charge pump 53. Up control signals are active with low voltage, whereas down control signals are active with high voltage.

First charge pump 52 selectively charges and discharges first capacitor 54. Where first charge pump 52 receives an up control signal with a long low voltage (up) pulse, a first node 67 is charged to a voltage ($V_1$) near Vdd. Where first charge pump 52 receives a down control signal with a long high voltage (down) pulse, first node 67 is discharged to a voltage ($V_1$) near ground potential. In a similar fashion, second charge pump 53 selectively charges and discharges a second node 68 located between second charge pump 53 and a third capacitor ($C_3$) 69. First voltage follower 55 attempts to maintain a voltage ($V_2$) on second node 68 at the same voltage as voltage ($V_1$) on first node 67. Without first voltage follower 55, voltage ($V_2$) on second node 68 would decay to ground potential at a time constant equal to the resistance of a resistor 62 times the capacitance of third capacitor 69. In an exemplary embodiment, resistor 62 has a resistance of about two hundred ohms, and third capacitor 69 has a capacitance in the order of three picofarads.

Although resistor 62 provides a resistance, resistance is also provided in the form of output impedance of voltage follower 55. In other embodiments, the output impedance of voltage follower 55 is sufficient such that resistor 62 is not required.

In the exemplary embodiments, second charge pump 53 pumps a relatively larger amount of current $I_2$ onto second node 68 than the current $I_1$ pumped by first charge pump 52 onto first node 67. In the exemplary embodiment, for example, $I_1$ is about ninety microamps and $I_2$ is about four hundred fifty microamps. First capacitor 54 has a larger capacitance (on the order of eighty picofarads) relative to the smaller capacitance of third capacitor 69 (roughly 3 picofarads). Second voltage follower 56 attempts to maintain control voltage $V_3$ on input lead 51 of VCO 42 at the same voltage as voltage $V_2$ on second node 68. The effect of second voltage follower 56 is to provide a more stable control voltage $V_3$ for VCO 42.

Compared to voltage $V_1$ on first node 67, voltage $V_2$ on second node 68 provides a coarser but faster adjustment to control voltage $V_3$. This allows CPLL 36 to reduce the tendency of clock signal 38 to overshoot the desired phase correction. Leakage compensation circuit 39 uses control voltage $V_3$ to generate compensation current 58 that is substantially equal to leakage current 57 through first capacitor 54. Control voltage $V_3$ tends to achieve an average, steady-state value faster than does voltage $V_1$ on first node 67. The average value of voltage $V_3$, however, is substantially equal to the average voltage $V_1$. Leakage current 57 through first capacitor 54 varies in relation to voltage $V_1$. Both second capacitor 59 of leakage compensation circuit 39 and first capacitor 54 are n-channel transistors manufactured in the same CMOS process. Therefore, a replication leakage current 70 through second capacitor 59 varies in relation to voltage $V_3$ in a manner substantially proportional to the manner by which leakage current 57 varies in relation to voltage $V_1$.

Although the input of leakage compensation circuit 39 is coupled to output lead 50 of loop filter 37 in the exemplary embodiment, and control voltage $V_3$ is used to generate compensation current 58, in other embodiments voltage $V_2$ on second node 68, or even voltage $V_1$ on first node 67, is used to generate compensation current 58.

Operational amplifier 60 maintains a voltage $V_4$ on second capacitor 59 at a voltage equal to voltage $V_3$. When voltage $V_4$ increases above voltage $V_3$, operational amplifier 60 increases a voltage $V_5$ on its output lead, which is coupled to the gates of first FET 61 and second FET 62. A high voltage $V_5$ on the gate of second p-channel FET 62 closes FET 62 and allows the voltage on second capacitor 59 to decrease as replication leakage current 70 leaks through second capacitor 59. Thus voltage $V_4$ is maintained at voltage $V_3$.

For any given voltage $V_3$ and corresponding voltage $V_1$, the ratio of the size of replication leakage current 70 to the size of leakage current 57 substantially equals the ratio of the area of second capacitor 59 and to the area of first capacitor 54. Second capacitor 59 is optimally as small as possible, yet not so small in comparison to first capacitor 54 that variations in the manufacturing processes skew the linear relationship between size and capacitance of these two capacitors. In the exemplary embodiment, second capacitor 59 has a capacitance on the order of twenty picofarads. The area of each capacitor 54 and 59 is the inversion channel width (W) of the capacitor times the channel length (L) between the two current handling terminals of that capacitor. In the exemplary embodiment, for example, the area of first capacitor 54 is about six thousand square microns, whereas second capacitor 59 has about one fourth the area or one thousand five hundred square microns. (Third capacitor 69 has an area of about two hundred fifty square microns.) Thus, in this embodiment, leakage current 57 is four times larger than replication leakage current 70.

First p-channel FET 61 and second p-channel FET 62 together form a current mirror. As the same voltage $V_5$ is present on the gate of first FET 61 and the gate of second FET 62, FET 61 passes a current that is proportional to the current passing through FET 62. Moreover, first FET 61 and second FET 62 each passes a current proportional to their respective ratios W/L, where W is the channel width and L is the channel length between source and drain (the two current handling terminals). Replication leakage current 70 that leaks through second capacitor 59 first passes through second FET 62. The current that passes through first FET 61 becomes compensation current 58. In the exemplary embodiment, the ratio W/L for first FET 61 is four times larger than the ratio W/L for second FET 62. Therefore, the current that passes through first FET 61 is four times larger than replication leakage current 70. Compensation current 58 is thus substantially equal to leakage current 57. In the exemplary embodiment, both compensation current 58 and leakage current 57 are less than about twenty microamps.

By applying compensation current 58 to first node 67, jitter in clock signal 38 that would be caused by uncompensated leakage current 57 is substantially eliminated. Even where compensation current 58 does not substantially equal leakage current 57, but nevertheless equals a significant portion of leakage current 57, the aforementioned jitter is substantially reduced. For example, 95% of jitter from uncompensated leakage current 57 could be eliminated where compensation current 58 is 80% the size of leakage current 57.

Figure 5:
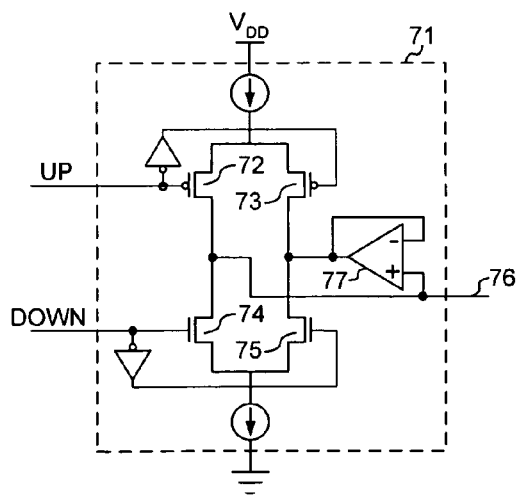
FIG. 5 is a simplified block diagram of a charge pump usable in the PLL of FIG. 4.

FIG. 5 is a block diagram of an alternate charge pump 71 that can be used in place of charge pumps 52 and 53. Charge pump 71 has two p-channel transistors 72 and 73, as well as two n-channel transistors 74 and 75. An up control signal UP and its complement are received on the gates of respective transistors 72 and 73, whereas a down control signal DOWN and its compliment are received on the gates of respective transistors 74 and 75. An output lead 76 of charge pump 71 is coupled to the non-inverting input lead of an operational amplifier 77. Where loop filter 37 employs charge pumps of the type shown in FIG. 5, output lead 76 of one charge pump is coupled to first node 67, and output lead 76 of a second charge pump is coupled to second node 68.

FIG. 6 shows a second embodiment of CPLL 36 that includes a leakage-compensated loop filter 78 comprised of loop filter 37 and a leakage compensation circuit 79. The same reference numerals are used in FIG. 6 as are used in FIG. 3 and FIG. 4 for the same or similar elements. Leakage compensation circuit 79 includes a third compensation charge pump 80, a p-channel FET transistor 81 and a second capacitor ($C_2$) 82. Unlike second capacitor 59 of the first embodiment, however, second capacitor ($C_2$) 82 does not replicate the current leakage through first capacitor ($C_1$) 54. For example, second capacitor 82 can be a low leakage capacitor with a small area, such as a thick oxide FET transistor. In the exemplary embodiment, second capacitor 82 has a capacitance of about ten picofarads. In another embodiment, third compensation charge pump 80 is of the type shown in FIG. 5.

Loop filter 37 is part of both the first and the second embodiments and functions analogously in both embodiments. A current handling terminal of FET 81 of leakage compensation circuit 79 is coupled to first node 67. Leakage compensation circuit 79 outputs a compensation current ($I_3$) 83 through FET 81 onto first node 67. Compensation current ($I_3$) 83 compensates for leakage current 57 because at steady state compensation current ($I_3$) 83 varies as a function of the up and down control signals, which in turn depend on leakage current 57. Moreover, compensation current ($I_3$) 83, with a magnitude substantially the same as that of leakage current 57, is generated by providing FET 81 with an appropriate W/L ratio.

Compensation current ($I_3$) 83 flows through FET 81 as a function of the up control signals and down control signals output by phase/frequency detector 40. Up control signals from phase/frequency detector 40 are received on the gate of a p-channel transistor 84 of third charge pump 80. Down control signals are received on the gate of an n-channel transistor 85 of third charge pump 80. Third charge pump 80 pumps a relatively smaller amount of current $I_4$ onto the gate of FET 81 than the current $I_1$ pumped by first charge pump 52 onto first node 67. In the exemplary embodiment, for example, current $I_4$ is about forty microamps, and $I_1$ is about ninety microamps. The voltage $V_4$ on the gate of FET 81 rises and falls as third charge pump 80 adds charge onto and subtracts charge off of the gate of FET 81. As voltage $V_4$ on the gate of FET 81 falls, FET 81 dumps more compensation current ($I_3$) 83 onto first node 67.

FIG. 7 shows the open-loop transfer function for the second embodiment of CPLL 36. The values of R, C and I correspond to the similarly referenced items shown in FIG. 6. The overall transfer function of CPLL 36 is expressed as the product of four transfer functions: the transfer function [$H_p(s)$] for phase/frequency detector 40, the transfer function [$H_{LLF}(s)$] for leakage-compensated loop filter 78, the transfer function [$H_{VCO}(s)$] for VCO 42, and the transfer function [$H_{DIV}(s)$] for frequency divider 43. The value $G_M$ is the transconductance of FET 81 and is related to the capacitance of second capacitor ($C_2$) 82, compensation current ($I_3$) 83 and current $I_4$ in the following manner: $I_3(s)=I_4 G_M/2\pi s C2$. In the exemplary embodiment, $G_M$ is about twenty microamps per volt. The gain of phase/frequency detector 40 ($K_p$ in the transfer function) is one, and the gain of VCO 42 ($K_{VCO}$ in the transfer function) is about nine GHz/V. The components of CPLL 36 are preferably chosen so that the loop is stable. For example, the values of capacitances and resistances of components of CPLL 36 are chosen so that loop gain falls below zero dB before the loop shifts the phase past −180 degrees, as is apparent from FIGS. 8 and 9. FIG. 7 also shows equation 86 indicating the solutions for the frequency of two zeros of the transfer function.

Figure 8:
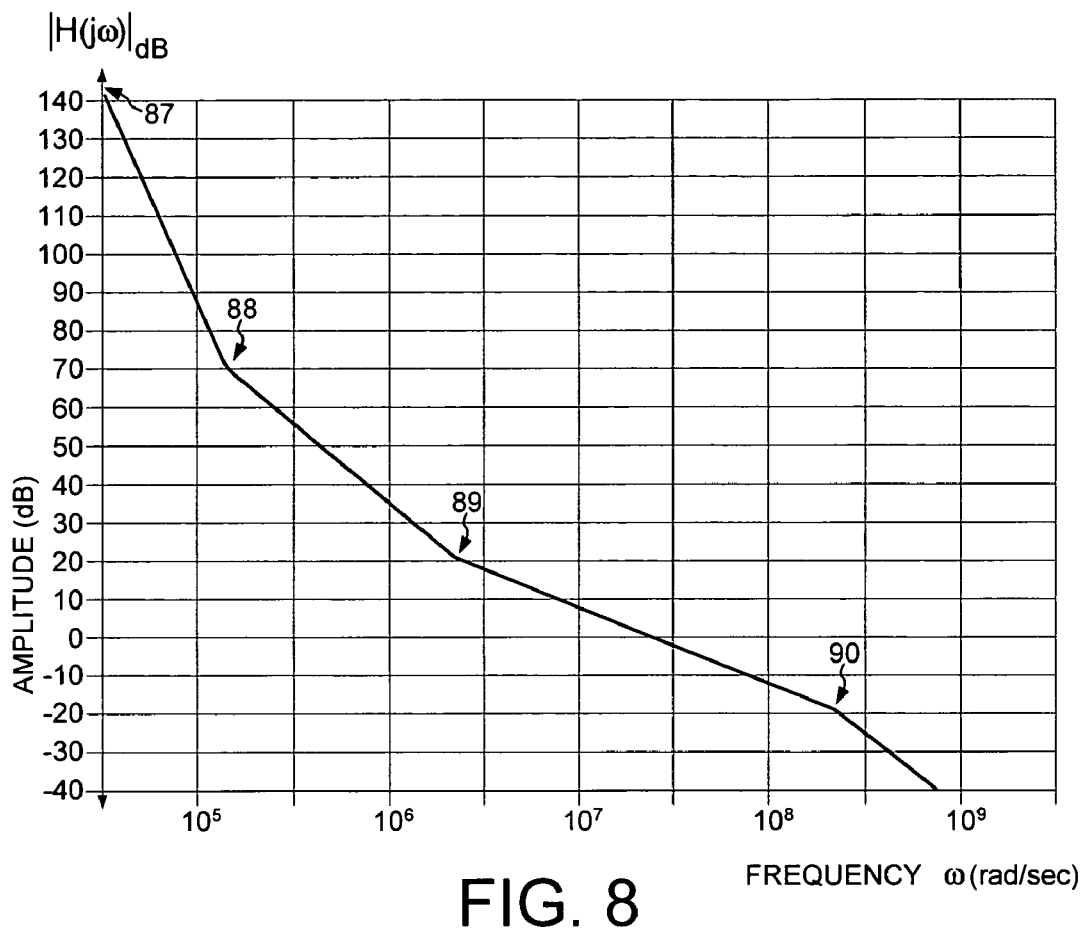
FIG. 8 is a Bode amplitude plot of the open-loop transfer function of FIG. 7.

FIG. 8 is a Bode plot showing the amplitude characteristics of CPLL 36 as described by the transfer function of FIG. 7. Bends in the plot represent frequencies of zero gain (zeros) and infinite gain (poles) in the transfer-function equation of FIG. 7. A third-order real pole 87 is present at zero radians/second. (On the logarithmic plot of FIG. 8, zero radians/second is never reached.) A zero 88 is present at the $(-b+(b2-4ac)^{1/2})/2a$ solution of equation 86. Between pole 87 and zero 88, the gain of CPLL 36 falls at sixty dB/decade. A zero 89 is present at the $(-b-(b2-4ac)^{1/2})/2a$ solution of equation 86. Between zero 88 and zero 89, the gain falls at forty dB/decade. A first-order real pole 90 is present at $-1/RC_3$. Between zero 89 and pole 90, gain falls at twenty dB/decade. At frequencies higher than pole 90, gain again falls at forty dB/decade.

Figure 9:
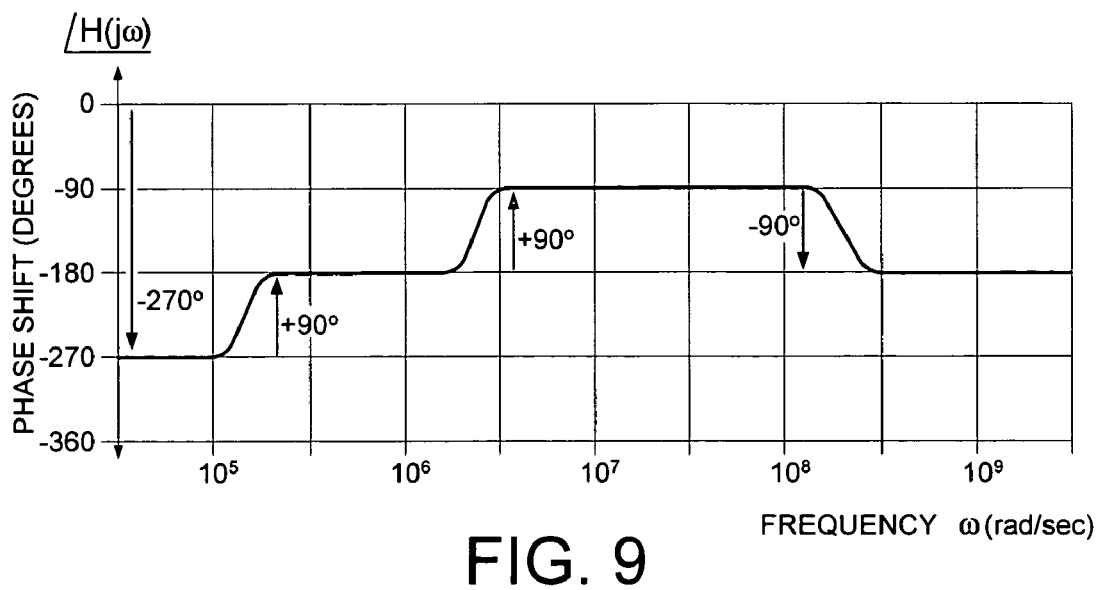
FIG. 9 is a Bode phase plot of the open-loop transfer function of FIG. 7.

FIG. 9 is a Bode plot showing the phase characteristics of CPLL 36 as described by the transfer function of FIG. 7. Signals on the loop change phase at the location of the zeros and poles, as shown by the bends in FIG. 8. A −270 degree phase shift occurs at zero radians/second. A +90 degree phase shift occurs at each of zeros 88 and 89. A −90 degree phase shift occurs at $-1/RC_3$.

Figure 10:
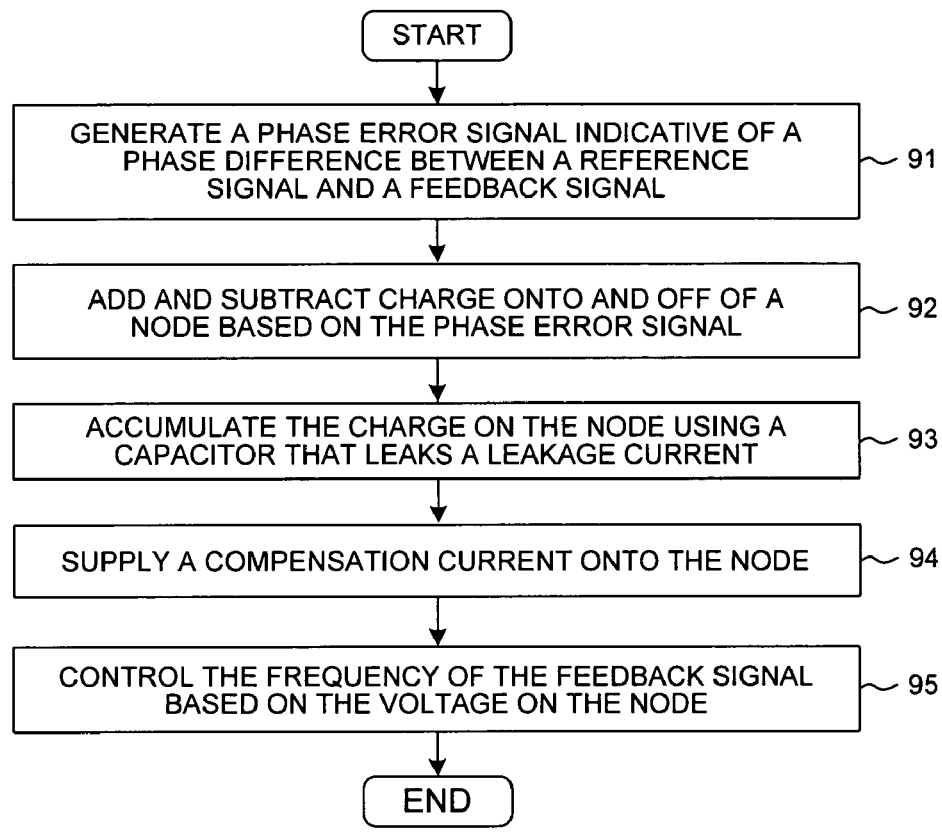
FIG. 10 is a flowchart of steps for supplying a compensation current to compensate for a leakage current.

FIG. 10 illustrates the steps 91–95 of a method for supplying a compensation current to compensate for a leakage current that leaks through an integration capacitor of a clock alignment circuit. Where the compensation current substantially equals the leakage current, noise caused by the leakage current is substantially eliminated. For example, where the magnitude of the compensation current is a proportion of the leakage current, a larger proportion of the noise from the leakage current can be eliminated.

Although the first and second embodiments of CPLL 36 are described in connection with phase-locked loops, leakage-compensated loop filter 41 and leakage-compensated loop filter 78 can be similarly employed to solve problems caused by leakage currents in other clock alignment circuits, such as delay-locked loops (DLLs).

Figure 11:
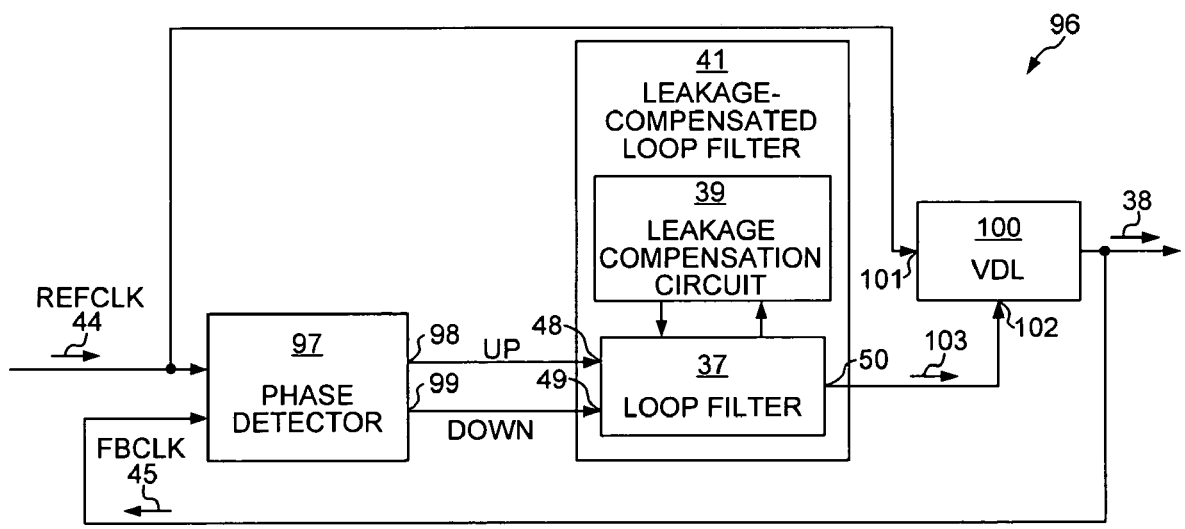
FIG. 11 is a simplified block diagram of a delay-locked loop with a leakage compensation circuit in accordance with a third embodiment.

FIG. 11 shows a compensating delay-locked loop (CDLL) 96 in a third embodiment of a compensating loop. CDLL 96 contains a phase detector 97 in place of phase/frequency detector 40 of CPLL 36. Phase detector 97 operates analogously to phase/frequency detector 40. When the phase of feedback signal 45 lags behind that of reference signal 44, up control signals are output onto an output lead 98 of phase detector 97. When the phase of feedback signal 45 leads that of reference signal 44, down control signals are output onto an output lead 99 of phase detector 97.

CDLL 96 contains a variable delay line (VDL) 100 in place of VCO 42. VDL 100 has a first input lead 101 that receives reference signal 44 and a second input lead 102 that is coupled to output lead 50 of loop filter 37. VDL 100 generates clock signal 38 by delaying reference signal 44 based on a signal 103 output by loop filter 37. Leakage compensation circuit 39 substantially offsets any leakage current across a capacitor of loop filter 37 by adding a compensation current to the capacitor. Leakage compensation circuit 39 thereby reduces errors in signal 103 that are caused by leakage current and avoids jitter in clock signal 38 that would otherwise be caused by leakage current. CDLL 96 does not include a frequency divider, as does CPLL 36.

Although the present invention is described in connection with certain specific embodiments for instructional purposes, the present invention is not limited thereto. For example, although the embodiments of compensating loops described above are manufactured using CMOS processes, other embodiments can be made using any other semiconductor process technology, such as processes employing Gallium Arsenide and bipolar processes. Moreover, although embodiments of a compensating phase-locked loop are described that include phase/frequency detectors, other embodiments of compensating phase-locked loops include only phase detectors. Accordingly, various modifications, adaptations, and combinations of various features of the described embodiments can be practiced without departing from the scope of the invention as set forth in the following claims.

What is claimed is:

1. A circuit comprising:
a first node that receives a first current;
an integration capacitor having a first terminal coupled to the first node and a second terminal coupled to a reference voltage source, wherein the integration capacitor integrates the first current to produce an integrated voltage, and wherein a first leakage current correlated to the integrated voltage leaks from the integration capacitor; and
a variable current source coupled to the first terminal, wherein the variable current source includes a second capacitor that leaks a second leakage current proportional to the first leakage current, wherein the variable current source generates a compensation current with a magnitude proportional to the second leakage current, and wherein the variable current source adds the compensation current to the first terminal of the integration capacitor.
wherein the variable current source includes a second capacitor that leaks a second leakage current.

2. A circuit comprising:
a first node that receives a first current;
an integration capacitor having a first terminal coupled to the first node and a second terminal coupled to a reference voltage source, wherein the integration capacitor integrates the first current to produce an integrated voltage, and wherein a first leakage current correlated to the integrated voltage leaks from the integration capacitor; and
a variable current source coupled to the first terminal, wherein the variable current source generates a compensation current;
wherein the variable current source includes a second capacitor that leaks a second leakage current; and
wherein the variable current source comprises a current mirror that generates the compensation current using the second leakage current.

3. The circuit of claim 2, further comprising:
an amplifier having an amplifier input terminal coupled to the first node and an amplifier output node coupled to the current mirror.

4. The circuit of claim 1, further comprising:
a charge pump that generates the first current in response to a least one of an up signal and a down signal.

5. The circuit of claim 4, wherein the variable current source generates the compensation current in response to at least one of the up signal and the down signal.

6. The circuit of claim 4, further comprising:
a phase and frequency detector coupled to the charge pump.

7. The circuit of claim 6, further comprising:
a voltage controlled oscillator coupled between the integration capacitor and the phase and frequency detector.

8. The circuit of claim 6, further comprising:
a divide-by-N circuit coupled to the phase and frequency detector.

9. A circuit comprising:
a first node that receives a first current;
an integration capacitor having a first terminal coupled to the first node and a second terminal coupled to a reference voltage source, wherein the integration capacitor integrates the first current to produce an integrated voltage, and wherein a first leakage current correlated to the integrated voltage leaks from the integration capacitor;
a variable current source coupled to the first terminal, wherein the variable current source generates a compensation current and adds the compensation current to the integration capacitor;
a charge pump that generates the first current in response to a least one of an up signal and a down signal;
a phase and frequency detector coupled to the charge pump; and
a variable delay line coupled between the integration capacitor and the phase and frequency detector.

10. The circuit of claim 1, wherein the second capacitor is a replica of the first capacitor.

11. The circuit of claim 1, wherein the circuit is part of a phase-locked loop.

12. The circuit of claim 1, wherein the circuit is part of a delay-locked loop.

13. The circuit of claim 1, wherein the second leakage current is substantially equal to the first leakage current.

14. A phase-locked loop comprising:
a phase detector that receives a first clock signal and a feedback clock signal and that outputs phase error signals;
a charge pump that generates a first current in response to the phase error signals;
an integration capacitor that integrates the first current, wherein the integration capacitor leaks a leakage current;
a leakage compensation circuit coupled to the integration capacitor, wherein the leakage compensation circuit generates a compensation current, wherein the integration capacitor integrates the first current, the leakage current, and the compensation current to produce an integration voltage; and
an output circuit that produces the feedback clock signal in response to the integration voltage;
wherein the leakage compensation circuit includes a compensation capacitor exhibiting a second leakage current.

15. A phase-locked loop comprising:
a phase detector that receives a first clock signal and a feedback clock signal and that outputs phase error signals;
a charge pump that generates a first current in response to the phase error signals;
an integration capacitor that integrates the first current, wherein the integration capacitor leaks a leakage current;
a leakage compensation circuit coupled to the integration capacitor, wherein the leakage compensation circuit generates a compensation current, wherein the integration capacitor integrates the first current, the leakage current, and the compensation current to produce an integration voltage; and
an output circuit that produces the feedback clock signal in response to the integration voltage;
wherein the leakage compensation circuit includes a compensation capacitor exhibiting a second leakage current; and
wherein the leakage compensation circuit comprises a current mirror that generates the compensation current using the second leakage current.

16. The phase-locked loop of claim 14, wherein the output circuit comprises a voltage controlled oscillator.

17. The phase-locked loop of claim 14, further comprising:
a divide-by-N circuit coupled to the output circuit and to the phase detector.

18. A delay locked loop comprising:
a phase detector that receives a first clock signal and a feedback clock signal and that outputs phase error signals;
a charge pump that generates a first current in response to the phase error signals;
a leakage compensation circuit that generates a compensation current;
an integration capacitor that integrates the first current and the compensation current to produce an integration voltage, and wherein the integration capacitor leaks a leakage current; and
an output circuit that generates the feedback clock signal in response to the integration voltage;
wherein the output circuit comprises a variable delay line.

19. A circuit comprising:
a loop filter having an input lead, a node and a capacitor, wherein a leakage current leaks from the node and through the capacitor;
a voltage-controlled oscillator having an input lead coupled to the output lead of the loop filter, wherein the voltage-controlled oscillator outputs an output signal having a frequency that depends on a voltage on the node; and
a leakage compensation circuit that supplies a compensation current onto the node, wherein the compensation current substantially equals the leakage current;
wherein the leakage compensation circuit includes a second capacitor that leaks a second leakage current and a current mirror that generates the compensation current using the second leakage current.

20. A method comprising:
generating a phase error signal indicative of a phase difference between a reference signal and a feedback signal;
adding and subtracting charge onto and off of a node based on the phase error signal;
accumulating the charge on the node using a first capacitor such that a voltage is present on the node, wherein the first capacitor leaks a leakage current;
supplying a compensation current onto the node, wherein the compensation current substantially equals the leakage current; and
controlling the frequency of the feedback signal based on the voltage on the node;
wherein the supplying the compensation current employs a second capacitor.

21. The circuit of claim 4, further comprising:
a phase detector coupled to the charge pump.

22. The circuit of claim 21, further comprising:
a voltage controlled oscillator coupled between the integration capacitor and the phase detector.

23. The circuit of claim 21, further comprising:
a divide-by-N circuit coupled to the phase detector.

24. The circuit of claim 21, further comprising:
a variable delay line coupled between the integration capacitor and the phase detector.

25. The circuit of claim 1, wherein the second capacitor is a scaled replica of the first capacitor.

26. The circuit of claim 1, wherein the variable current source uses the second leakage current to generate the compensation current.

* * * * *